(12) United States Patent
Wu et al.

(10) Patent No.: US 11,923,435 B2
(45) Date of Patent: Mar. 5, 2024

(54) HIGH VOLTAGE SEMICONDUCTOR DEVICE AND MANUFACTURING METHOD THEREOF

(71) Applicant: UNITED MICROELECTRONICS CORP., Hsin-Chu (TW)

(72) Inventors: Hsin-Han Wu, Hsinchu (TW); Kai-Kuen Chang, Hsinchu (TW); Ping-Hung Chiang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/723,438

(22) Filed: Apr. 18, 2022

(65) Prior Publication Data

US 2023/0307524 A1  Sep. 28, 2023

(30) Foreign Application Priority Data

Mar. 28, 2022  (CN) .......................... 202210311169.3

(51) Int. Cl.
*H01L 29/66* (2006.01)
*H01L 29/78* (2006.01)

(52) U.S. Cl.
CPC .... *H01L 29/6656* (2013.01); *H01L 29/66674* (2013.01); *H01L 29/7801* (2013.01)

(58) Field of Classification Search
CPC .......................... H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 29/66712; H01L 20/7802; H01L 29/7809; H01L 29/781; H01L 21/76224; H01L 29/66613; H01L 29/7824; H01L 29/66681–66704; H01L 29/7816–7826
See application file for complete search history.

(56) References Cited

U.S. PATENT DOCUMENTS

| | | | |
|---|---|---|---|
| 9,728,616 | B2 | 8/2017 | Hsiao |
| 10,008,573 | B1 | 6/2018 | Hsiao |
| 2016/0020334 | A1* | 1/2016 | Jen ..................... H01L 29/66833 438/283 |
| 2017/0025531 | A1* | 1/2017 | Chang ................. H01L 29/1095 |
| 2022/0115536 | A1* | 4/2022 | Chen ................. H01L 29/66689 |

* cited by examiner

*Primary Examiner* — Mohammad A Rahman
(74) *Attorney, Agent, or Firm* — Winston Hsu

(57) ABSTRACT

A high voltage semiconductor device includes a semiconductor substrate, a first drift region, a gate structure, a first sub gate structure, a first spacer structure, a second spacer structure, and a first insulation structure. The first drift region is disposed in the semiconductor substrate. The gate structure is disposed on the semiconductor substrate and separated from the first sub gate structure. The first sub gate structure and the first insulation structure are disposed on the first drift region. The first spacer structure is disposed on a sidewall of the gate structure. The second spacer structure is disposed on a sidewall of the first sub gate structure. At least a part of the first insulation structure is located between the first spacer structure and the second spacer structure. The first insulation structure is directly connected with the first drift region located between the first spacer structure and the second spacer structure.

13 Claims, 15 Drawing Sheets

HIGH VOLTAGE SEMICONDUCTOR DEVICE AND MANUFACTURING METHOD THEREOF

BACKGROUND OF THE INVENTION

1. Field of the Invention

The present invention relates to a high voltage semiconductor device and a manufacturing method thereof, and more particularly, to a high voltage semiconductor device including an insulation structure and a drift region connected with each other and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the feature sizes continue to shrink, how to improve the electrical performance of the high voltage semiconductor units and/or the process integration with other components through design modifications in structure and/or process is still a continuous issue for those in the relevant fields.

SUMMARY OF THE INVENTION

A high voltage semiconductor device and a manufacturing method thereof are provided in the present invention. An insulation structure is connected with a drift region for avoiding forming silicide on a specific portion of the drift region and improving electrical performance of the high voltage semiconductor device accordingly.

According to an embodiment of the present invention, a high voltage semiconductor device is provided. The high voltage semiconductor device includes a semiconductor substrate, a first drift region, a gate structure, a first sub gate structure, a first spacer structure, a second spacer structure, and a first insulation structure. The first drift region is disposed in the semiconductor substrate, the gate structure is disposed on the semiconductor substrate, and the first sub gate structure is disposed on the first drift region and separated from the gate structure. The first spacer structure is disposed on a sidewall of the gate structure, the second spacer structure is disposed on a sidewall of the first sub gate structure, and the first insulation structure is disposed on the first drift region. At least a part of the first insulation structure is located between the first spacer structure and the second spacer structure, a first portion of the first drift region is located between the first spacer structure and the second spacer structure, and the first insulation structure is directly connected with the first portion of the first drift region.

According to an embodiment of the present invention, a manufacturing method of a high voltage semiconductor device is provided. The manufacturing method includes the following steps. A first drift region is formed in a semiconductor substrate. A gate structure is formed on the semiconductor substrate. A first sub gate structure is formed on the first drift region, and the first sub gate structure is separated from the gate structure. A first spacer structure is located on a sidewall of the gate structure, a second spacer structure is located on a sidewall of the first sub gate structure, and a first insulation structure is located on the first drift region. At least a part of the first insulation structure is located between the first spacer structure and the second spacer structure. A portion of the first drift region is located between the first spacer structure and the second spacer structure, and the first insulation structure is directly connected with the portion of the first drift region.

According to another embodiment of the present invention, a high voltage semiconductor device is provided. The high voltage semiconductor device includes a semiconductor substrate, a first drift region, a gate structure, a spacer structure, a first source/drain doped region, a first silicide layer, and a first insulation structure. The first drift region is disposed in the semiconductor substrate, the gate structure is disposed on the semiconductor substrate, and the spacer structure is disposed on a sidewall of the gate structure. The first source/drain doped region is disposed in the first drift region, and the first source/drain doped region is separated from the spacer structure. The first silicide layer is disposed on the first source/drain doped region, and the first silicide layer is separated from the spacer structure. A portion of the first drift region is located between the spacer structure and the first source/drain doped region. The first insulation structure is disposed on the first drift region, and the first insulation structure is directly connected with the portion of the first drift region located between the spacer structure and the first source/drain doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-7 are schematic drawings illustrating a manufacturing method of the high voltage semiconductor device according to the first embodiment of the present invention, wherein FIG. 4 is a top view schematic drawing corresponding to FIG. 3, FIG. 5 is a schematic drawing in a step subsequent to FIG. 3, FIG. 6 is a schematic drawing in a step subsequent to FIG. 5, and FIG. 7 is a schematic drawing in a step subsequent to FIG. 6.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
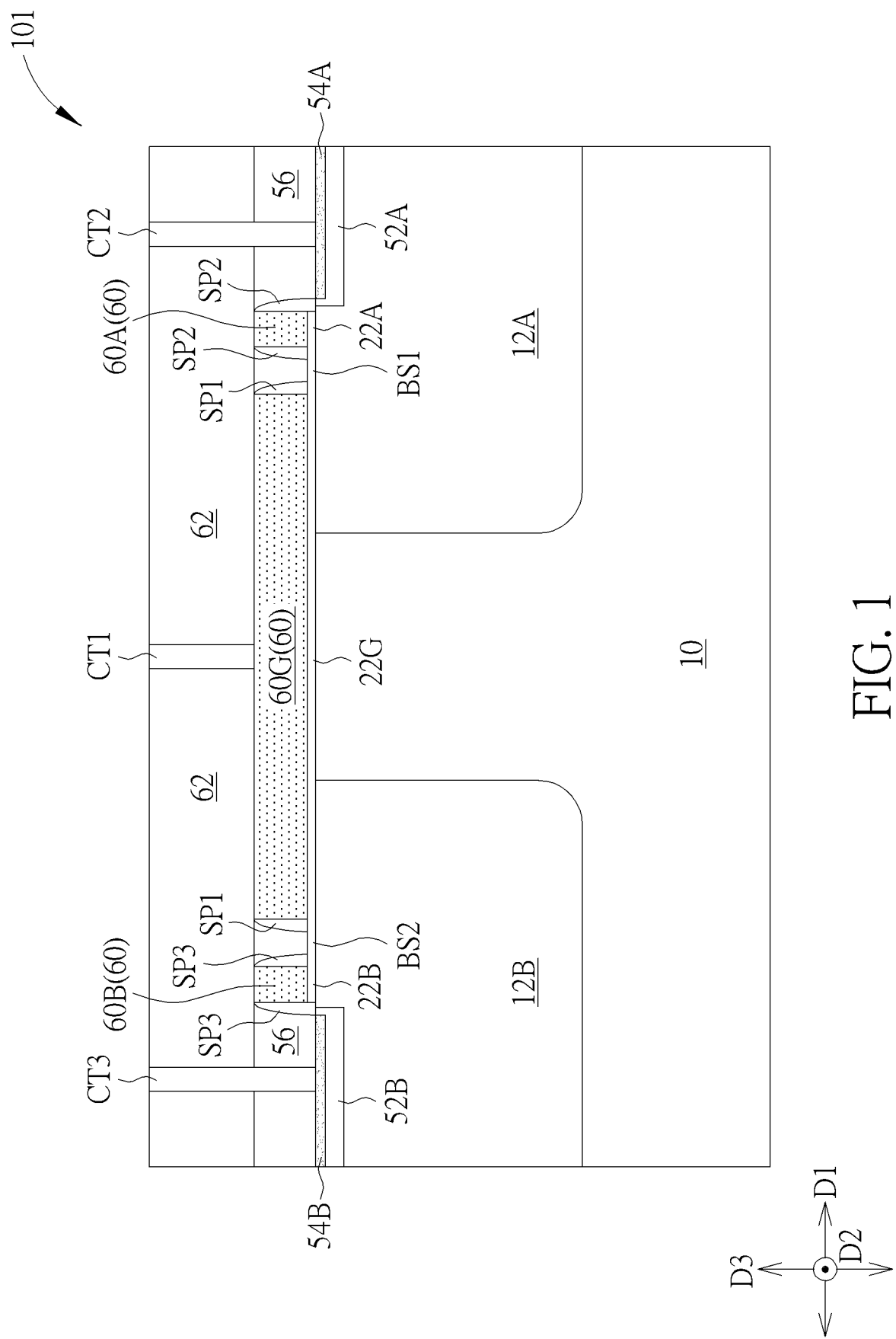
FIG. 1 is a schematic drawing illustrating a high voltage semiconductor device according to a first embodiment of the present invention.
Figure 2:
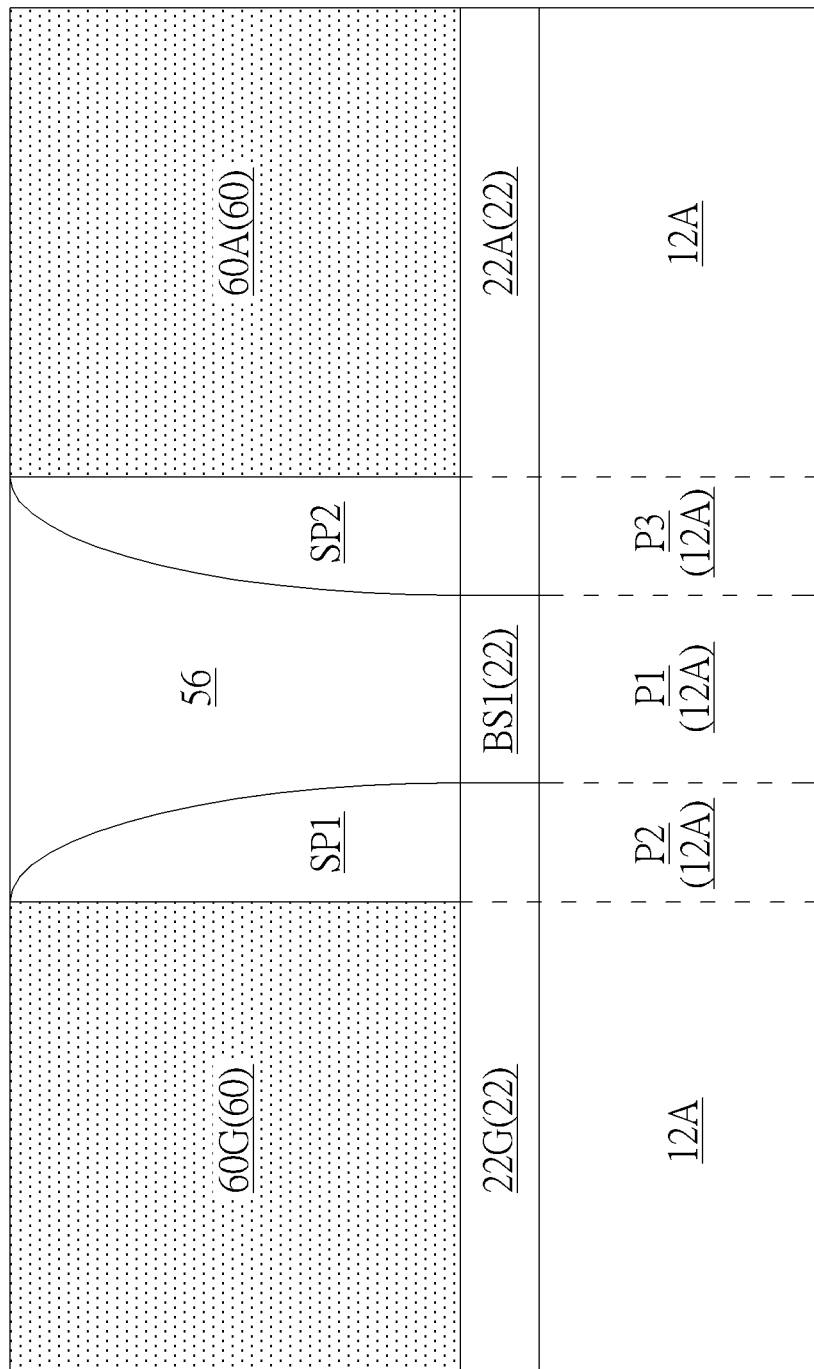
FIG. 2 is a schematic drawing illustrating an enlarged portion of the high voltage semiconductor device according to the first embodiment of the present invention.

Please refer to FIG. 1 and FIG. 2. FIG. 1 is a schematic drawing illustrating a high voltage semiconductor device 101 according to a first embodiment of the present invention, and FIG. 2 is a schematic drawing illustrating an enlarged portion of the high voltage semiconductor device 101 in this embodiment. As shown in FIG. 1 and FIG. 2, the high voltage semiconductor device 101 includes a semiconductor substrate 10, a first drift region 12A, a gate structure 60G, a sub gate structure 60A, a spacer structure SP1, a spacer structure SP2, and a first insulation structure BS1. The first drift region 12A is disposed in the semiconductor substrate 10, the gate structure 60G is disposed on the semiconductor substrate 10, and the sub gate structure 60A is disposed on the first drift region 12A and separated from the gate structure 60G. The spacer structure SP1 is disposed on a sidewall of the gate structure 60G, the spacer structure SP2 is disposed on a sidewall of the sub gate structure 60A, and the first insulation structure BS1 is disposed on the first drift region 12A. At least a part of the first insulation structure BS1 is located between the spacer structure SP1 and the spacer structure SP2, a first portion P1 of the first drift region 12A is located between the spacer structure SP1 and the spacer structure SP2, and the first insulation structure BS1 is directly connected with the first portion P1 of the first drift region 12A. In some embodiments, the first insulation structure BS1 directly connected with the first portion P1 of the first drift region 12A may be used to avoid forming a silicide layer on the first drift region 12A located between the spacer structure SP1 and the spacer structure SP2, and the purpose of improving the electrical performance of the high voltage semiconductor device (such as reducing off current $I_{off}$ of the high voltage semiconductor device, but not limited thereto) may be achieved accordingly.

In some embodiments, a vertical direction (such as a third direction D3 shown in FIG. 1 and FIG. 2) may be regarded as a thickness direction of the semiconductor substrate 10, and the semiconductor substrate 10 may have a top surface and a bottom surface opposite to the top surface in the third direction D3. The gate structure 60G, the sub gate structure 60A, the spacer structure SP1, the spacer structure SP2, and the first insulation structure BS1 described above may be disposed on the side of the top surface of the semiconductor substrate 10. In addition, horizontal directions substantially orthogonal to the third direction D3 (such as a first direction D1 and a second direction D2 shown in FIGS. 1-2 and other directions orthogonal to the third direction D3) may be substantially parallel with the top surface and/or the bottom surface of the semiconductor substrate 10, but not limited thereto. In this description, a distance between the bottom surface of the semiconductor substrate 10 and a relatively higher location and/or a relatively higher part in the third direction D3 is greater than a distance between the bottom surface of the semiconductor substrate 10 and a relatively lower location and/or a relatively lower part in the third direction D3. The bottom or lower portion of each component may be closer to the bottom surface S2 of the semiconductor substrate 10 in the third direction D3 than the top or upper portion of this component. Another component disposed above a specific component may be regarded as being relatively far from the bottom surface of the semiconductor substrate 10 in the third direction D3, and another component disposed under a specific component may be regarded as being relatively closer to the bottom surface of the semiconductor substrate 10 in the third direction D3.

Specifically, in some embodiments, the high voltage semiconductor device 101 may further include a gate oxide layer 22G and a gate oxide layer 22A. The gate oxide layer 22G may be disposed between the semiconductor substrate 10 and the gate structure 60G in the third direction D3, and the gate oxide layer 22A may be disposed between the first drift region 12A and the sub gate structure 60A in the third direction D3. In some embodiments, a part of the gate oxide layer 22G may be sandwiched between the spacer structure SP1 and the first drift region 12A in the third direction D3, and a part of the gate oxide layer 22A may be sandwiched between the spacer structure SP2 and the first drift region 12A in the third direction D3, but not limited thereto. In other words, the gate oxide layer 22G may extend from the area under the gate structure 60G to the area under the spacer structure SP1, and the gate oxide layer 22A may extend from the area under the sub gate structure 60A to the area under the spacer structure SP2. Additionally, in some embodiments, the first insulation structure BS1 may be sandwiched between the gate oxide layer 22G and the gate oxide layer 22A in the first direction D1, and the first insulation structure BS1 may be directly connected with the gate oxide layer 22G and the gate oxide layer 22A, but not limited thereto. In some embodiments, a material composition of the first insulation structure BS1, a material composition of the gate oxide layer 22G, and a material composition of the gate oxide layer 22A may be identical to one another, such as being the same insulation oxide material, but not limited thereto.

In some embodiments, a second portion P2 of the first drift region 12A may be located under the spacer structure SP1 in the third direction D3, a third portion P3 of the first drift region 12A may be located under the spacer structure SP2 in the third direction D3, and the first portion P1 of the first drift region 12A may be sandwiched between the second portion P2 of the first drift region 12A and the third portion P3 of the first drift region 12A in the first direction D1. In other words, the first drift region 12A located between the spacer structure SP1 and the spacer structure SP2 (such as the first portion P1) may be completely covered by the first insulation structure BS1, and the first drift region 12A located between the gate structure 60G and the sub gate structure 60A (such as the first portion P1, the second portion P2, and the third portion P3) may be completely covered by the first insulation structure BS1, the spacer structure SP1, and the spacer structure SP2 for avoiding forming electrically conductive material (such as an electrically conductive silicide layer) directly on the first portion P1, the second portion P2, and/or the third portion P3 of the first drift region 12A.

In some embodiments, the high voltage semiconductor device 101 may further include a source/drain doped region 52A and a silicide layer 54A, the source/drain doped region may be disposed in the first drift region 12A, and the silicide layer 54A may be disposed in the source/drain doped region 52A and/or disposed on the source/drain doped region 52A. The sub gate structure 60A may be located between the gate structure 60G and the source/drain doped region 52A in the first direction D1, and the sub gate structure 60A may be electrically separated from the gate structure 60G and the source/drain doped region 52A. The distance between the gate structure 60G and the source/drain doped region 52A and/or the distance between the gate structure 60G and the silicide layer 54A may be increased by the disposition of the sub gate structure 60A, and the electrically conductive silicide layer may be kept from being formed on the first drift region 12A located between the spacer structure SP1 and the spacer structure SP2 and/or the first drift region 12A located between the gate structure 60G and the sub gate structure 60A by the disposition of the first insulation structure BS1. Accordingly, the electrical performance of the high voltage semiconductor device 101 may be improved (for example, the off current may be reduced, but not limited thereto).

In some embodiments, the high voltage semiconductor device 101 may further include a second drift region 12B, a sub gate structure 60B, a spacer structure SP3, a second insulation structure BS2, a gate oxide layer 22B, a source/drain doped region 52B, and a silicide layer 54B. The second drift region 12B may be disposed in the semiconductor substrate 10, and a part of the first drift region 12A and a part of the second drift region 12B may be located at two opposite sides of the gate structure 60G in the first direction D1, respectively. The sub gate structure 60B may be disposed on the second drift region 12B and separated from the gate structure 60G. The sub gate structure 60A and the sub gate structure 60B may be located at two opposite sides of the gate structure 60G in the first direction D1, respectively. The spacer structure SP3 may be disposed on a sidewall of the sub gate structure 60B, the second insulation structure BS2 may be disposed on the second drift region 12B, and at least a part of the second insulation structure BS2 may be located between the spacer structure SP1 and the spacer structure SP3. A portion of the second drift region 12B may be located between the spacer structure SP1 and the spacer structure SP3, and the second insulation structure BS2 may be directly connected with the portion of the second drift region 12B located between the spacer structure SP1 and the spacer structure SP3.

In some embodiments, the gate oxide layer 22B may be disposed between the second drift region 12B and the sub gate structure 60B in the third direction D3, and a part of the gate oxide layer 22B may be sandwiched between the spacer structure SP3 and the second drift region 12B in the third direction D3, but not limited thereto. In other words, the gate oxide layer 22B may extend from the area under the sub gate structure 60B to the area under the spacer structure SP3. Additionally, in some embodiments, the second insulation structure BS2 may be sandwiched between the gate oxide layer 22G and the gate oxide layer 22B in the first direction D1, and the second insulation structure BS2 may be directly connected with the gate oxide layer 22G and the gate oxide layer 22B, but not limited thereto. In some embodiments, a material composition of the second insulation structure BS2, the material composition of the gate oxide layer 22G, and a material composition of the gate oxide layer 22B may be identical to one another, such as being the same insulation oxide material, but not limited thereto.

In some embodiments, the source/drain doped region 52B may be disposed in the second drift region 12B, and the silicide layer 54B may be disposed in the source/drain doped region 52B and/or disposed on the source/drain doped region 52B. The sub gate structure 60B may be located between the gate structure 60G and the source/drain doped region 52B in the first direction D1, and the sub gate structure 60B may be electrically separated from the gate structure 60G and the source/drain doped region 52B. The distance between the gate structure 60G and the source/drain doped region 52B and/or the distance between the gate structure 60G and the silicide layer 54B may be increased by the disposition of the sub gate structure 60B also, and the electrically conductive silicide layer may be kept from being formed on the second drift region 12B located between the spacer structure SP1 and the spacer structure SP3 and/or the second drift region 12B located between the gate structure 60G and the sub gate structure 60B by the disposition of the second insulation structure BS2. In some embodiments, the source/drain doped region 52A and the source/drain doped region 52B may be a source doped region and a drain doped region, respectively. For example, the source/drain doped region 52B may be a source doped region when the source/drain doped region 52A is a drain doped region, and the source/drain doped region 52A may be a source doped region when the source/drain doped region 52B is a drain doped region. In addition, the high voltage semiconductor device 101 may be regarded as a double diffused drain MOS (DDDMOS) structure, but not limited thereto.

In some embodiments, the high voltage semiconductor device 101 may further include an insulation layer 56, a dielectric layer 62, and a plurality of contact structures (such as a contact structure CT1, a contact structure CT2, and a contact structure CT3 illustrated in FIG. 1). The insulation layer 56 may cover the silicide layer 54A, the source/drain doped region 52A, the silicide layer 54B, and the source/drain doped region 52B. The insulation layer 56 may be partly disposed between the spacer structure SP1 and the spacer structure SP2 and partly disposed between the space structure SP1 and the spacer structure SP3. The dielectric layer 62 may be disposed on the insulation layer 56 and cover the gate structure 60G, the sub gate structure 60A, and the sub gate structure 60B. The contact structure CT1 may penetrate through the dielectric layer 62 for contacting and being electrically connected with the gate structure 60G, the contact structure CT2 may penetrate through the dielectric layer 62 and the insulation layer 56 for contacting and being electrically connected with the silicide layer 54A and/or the source/drain doped region 52A, and the contact structure CT3 may penetrate through the dielectric layer 62 and the insulation layer 56 for contacting and being electrically connected with the silicide layer 54B and/or the source/drain doped region 52B.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate made of other suitable semiconductor materials. Additionally, the first drift region 12A and the second drift region 12B may include doped regions formed by performing a doping process (such as an implantation process) to the semiconductor substrate 10. The semiconductor substrate 10 may be a semiconductor substrate with a first conductivity type or include a first conductivity type region (such as a doped well region with the first conductive type, not illustrated), the first drift region 12A and the second drift region 12B may have a second conductivity type, and the second conductivity type may be complementary to the first conductivity type. For example, the first conductivity type may be p-type, and the second conductivity type may be n-type, but not limited thereto. In some embodiments, the source/drain region 52A and the source/drain region 52B may include doped regions formed in the semiconductor substrate 10 by a doping process (such as an implantation process). In some embodiments, the conductivity type of the source/drain region 52A and the source/drain region 52B may be identical to the conductivity type of the first drift region 12A and the second drift region 12B, but the dopant concentration of the source/drain region 52A and the source/drain region 52B may be higher than that of the first drift region 12A and the second drift region 12B. For example, the source/drain region 52A and the source/drain region 52B may be n-type heavily doped regions, but not limited thereto.

In some embodiments, the material used for forming the gate oxide layer 22G, the gate oxide layer 22A, the gate oxide layer 22B, the first insulation structure BS1, and the second insulation structure BS2 may include silicon oxide or other suitable oxide insulation materials. In some embodiments, the gate structure 60G, the sub gate structure 60A, and the sub gate structure 60B may be formed with the same material (such as a gate material 60), and the gate material 60 may include a gate dielectric layer (not illustrated) and a gate electrode layer (not illustrated) disposed on the gate dielectric layer. The gate dielectric layer may include high dielectric constant (high-k) dielectric material or other suitable dielectric materials, and the gate electrode layer may include a non-metallic electrically conductive material (such as doped polysilicon) or a metallic electrically conductive material, such as a metal gate structure formed with a work function layer and a low electrical resistivity layer stacked with each other, but not limited thereto. In some embodiments, the spacer structure SP1, the spacer structure SP2, and the spacer structure SP3 may include a single layer or multiple layers of dielectric materials, such as silicon nitride, silicon oxide, silicon oxynitride, or other suitable dielectric materials. The silicide layer 54A and the silicide layer 54B may include electrically conductive silicide materials, such as metal silicide materials, but not limited thereto. The metal silicide described above may include cobalt-silicide, nickel-silicide, or other suitable metal silicide. The insulation layer 56 may include a single layer or multiple layers of insulation materials, such as silicon nitride, silicon oxide, or other suitable insulation materials. The dielectric layer 62 may include a single layer or multiple layers of dielectric materials, such as silicon oxide, silicon nitride, silicon oxynitride, a low dielectric constant (low-k) dielectric material, or other suitable dielectric materials. Additionally, each contact structure may include a low resistivity material (such as copper, aluminum, tungsten, and so forth) and a barrier layer (such as titanium nitride, tantalum nitride, or other suitable electrically conductive barrier materials) encompassing the low resistivity material, but not limited thereto.

Figure 3:
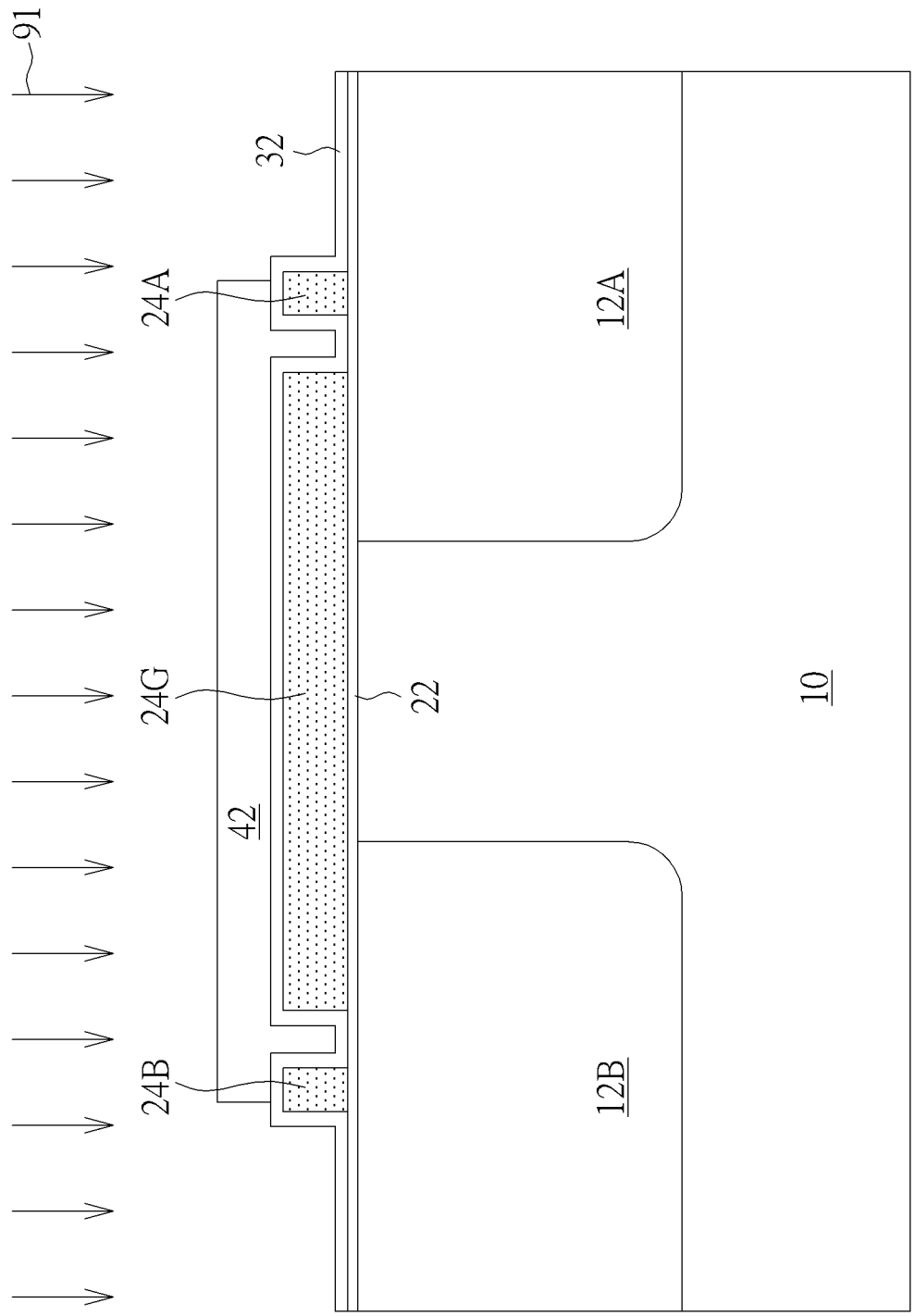
Figure 4:
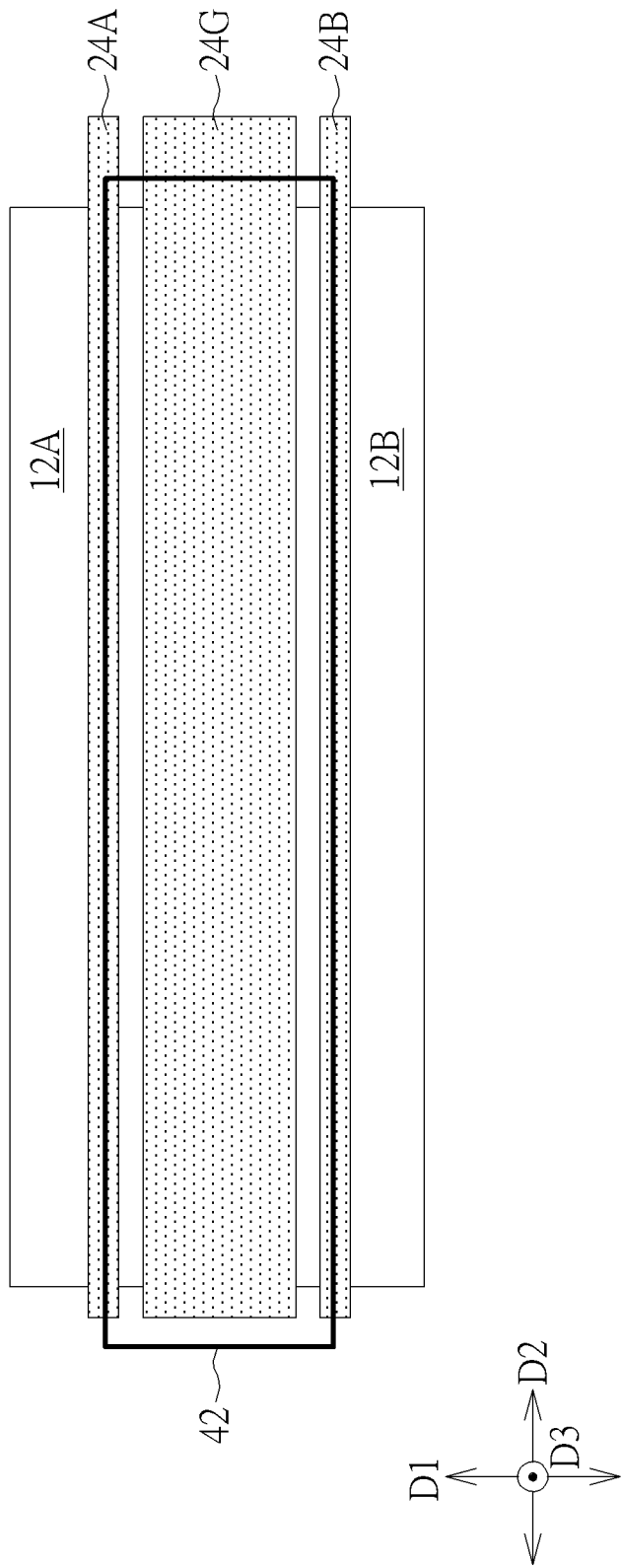
Figure 5:
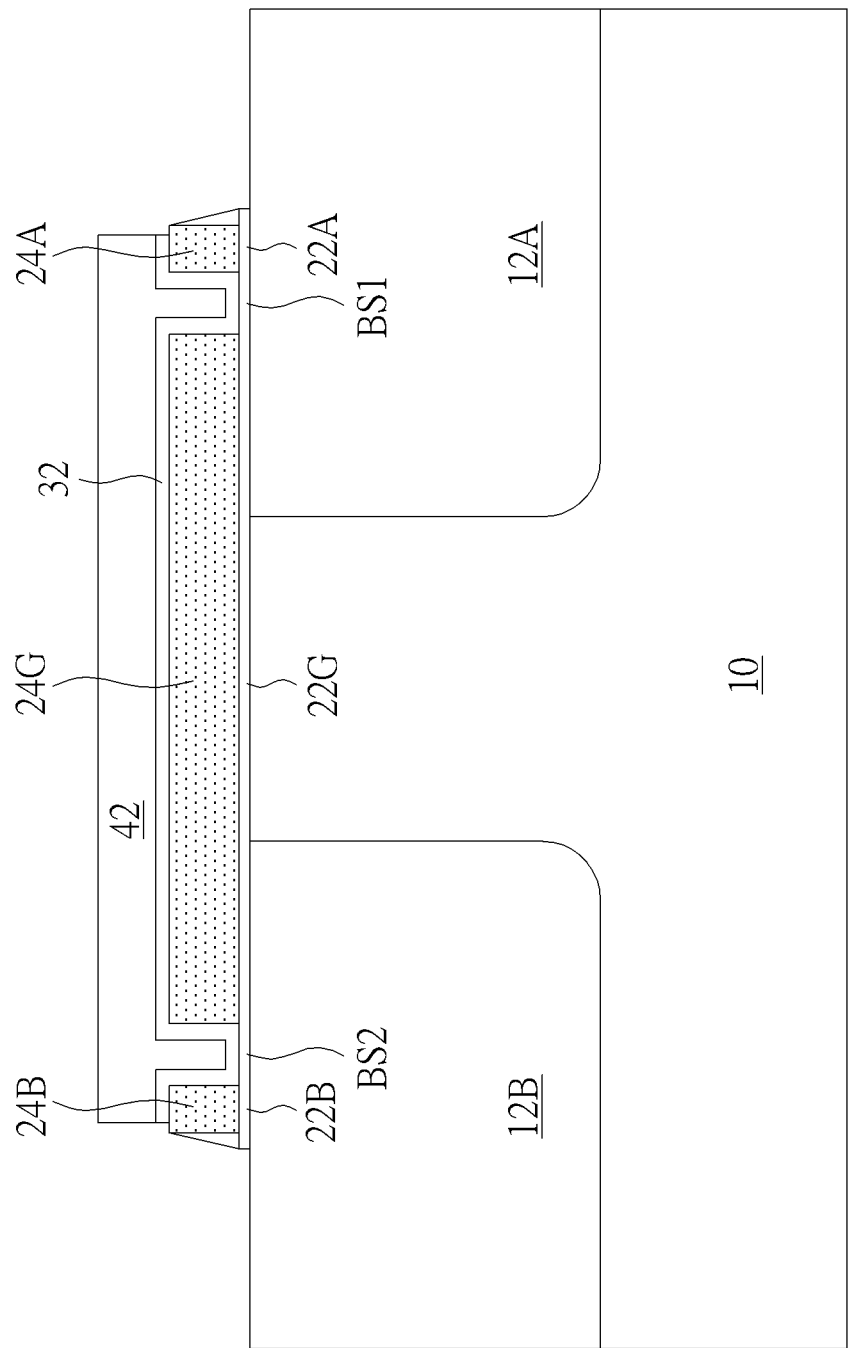
Figure 6:
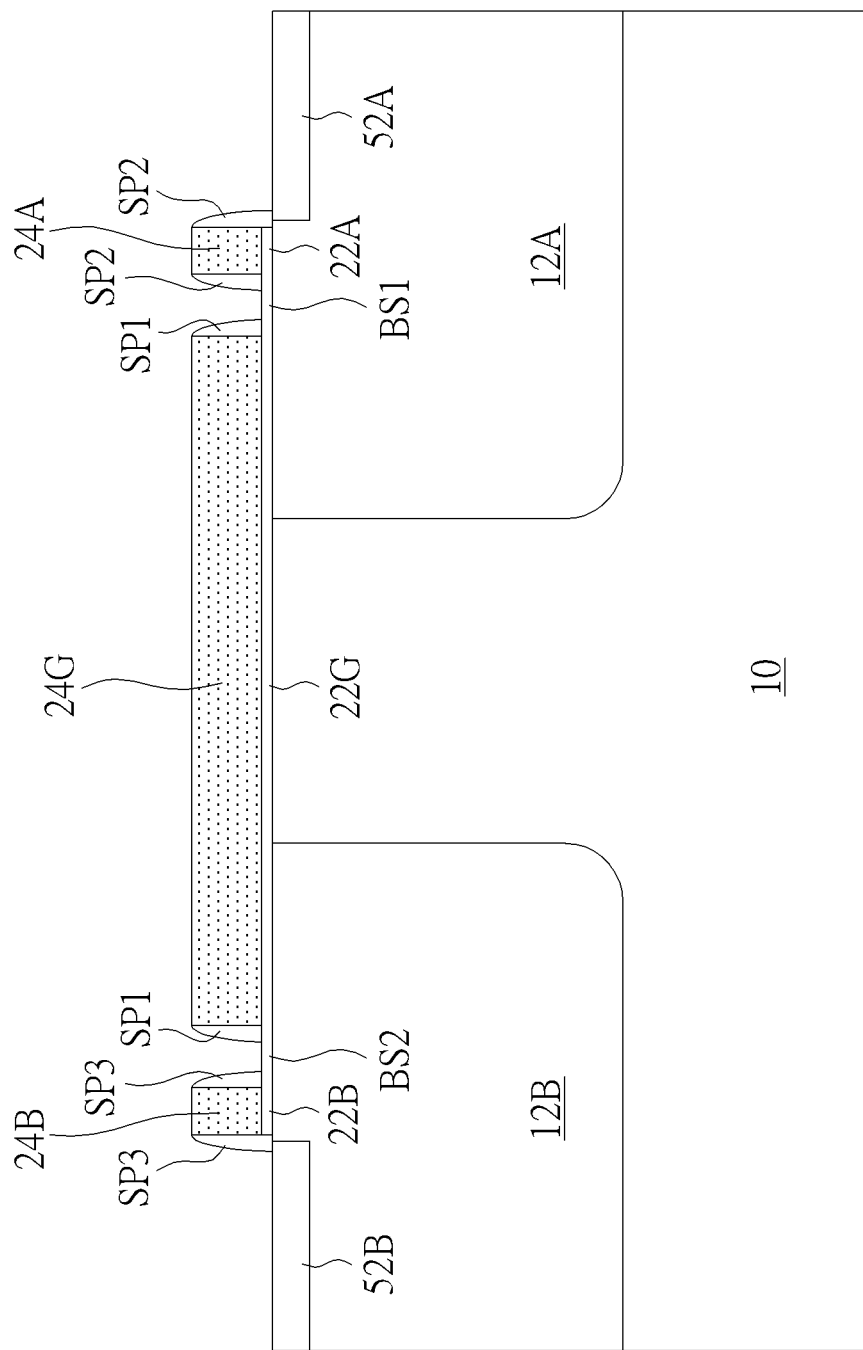
Figure 7:
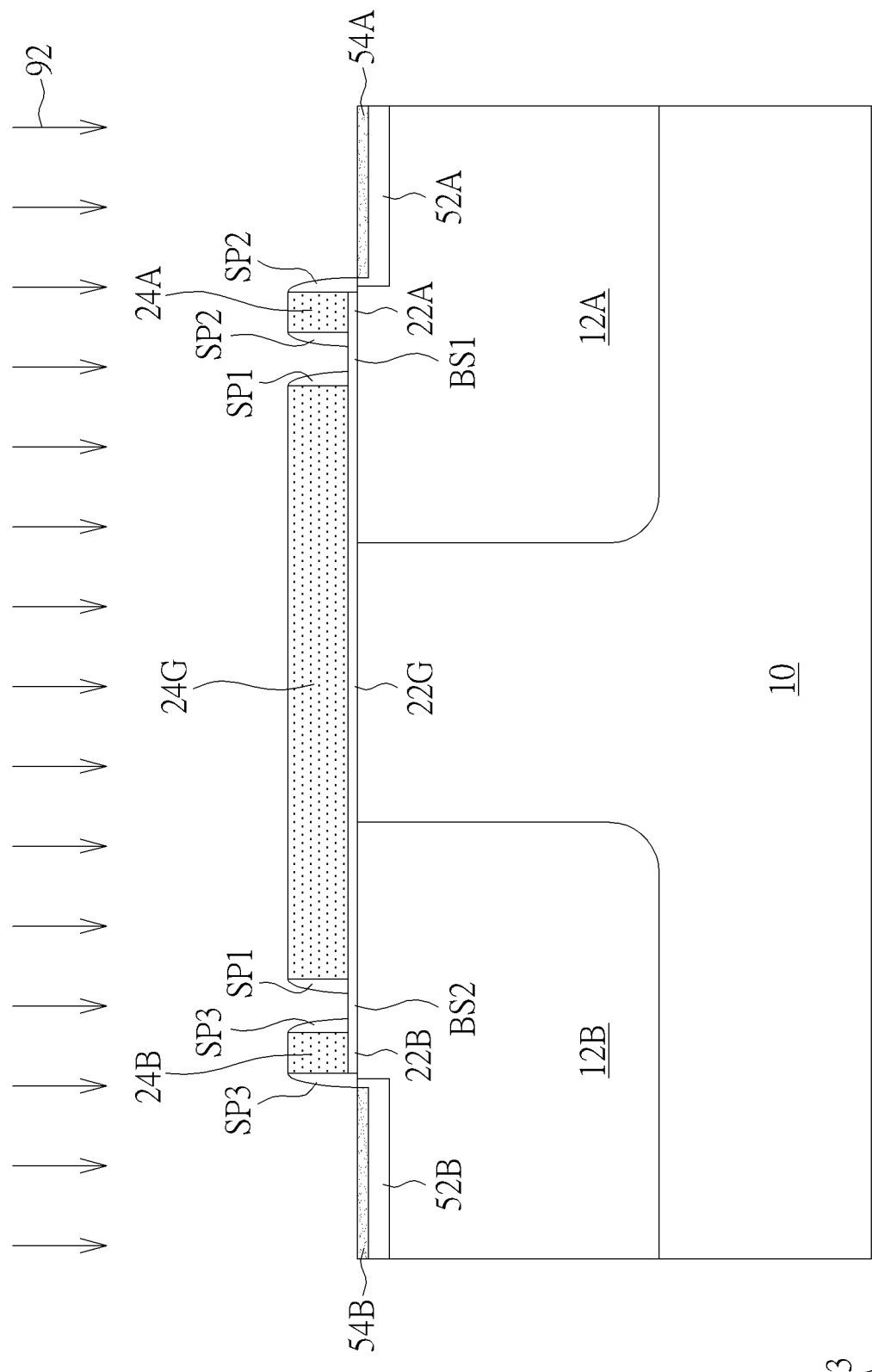
Figure 8:
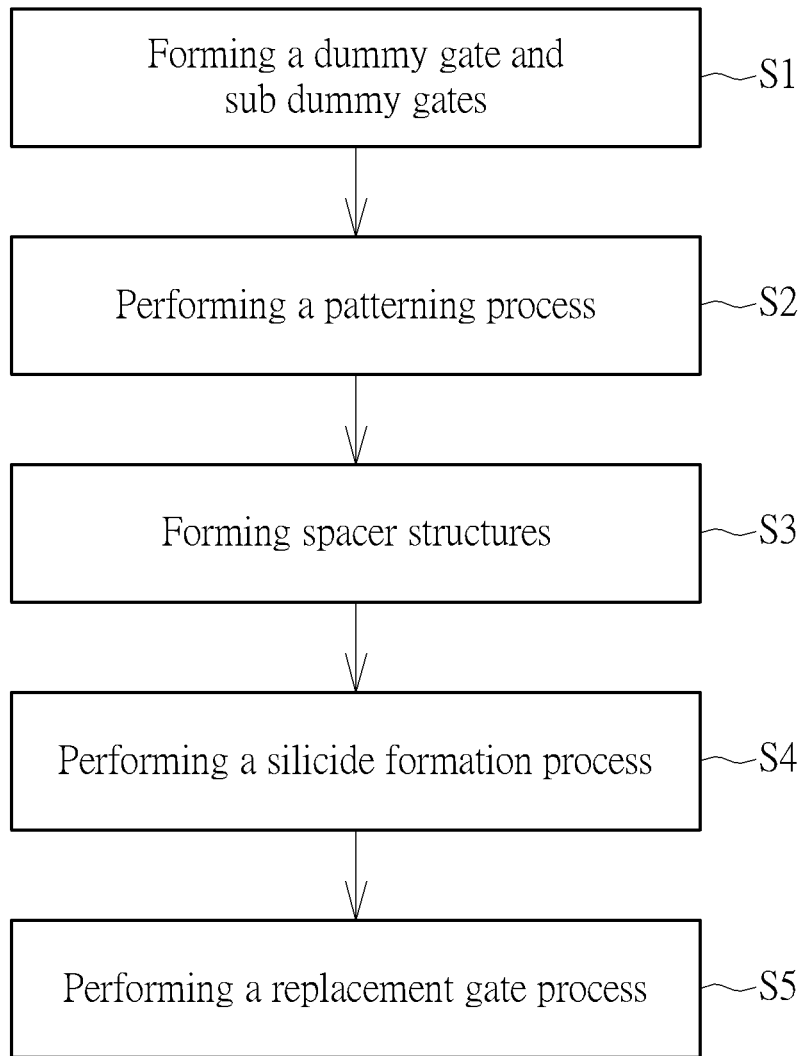
FIG. 8 is a flow chart of a manufacturing method of a high voltage semiconductor device according to an embodiment of the present invention.

Please refer to FIGS. 1-8. FIGS. 3-7 are schematic drawings illustrating a manufacturing method of the high voltage semiconductor device according to the first embodiment of the present invention, wherein FIG. 4 is a top view schematic drawing corresponding to FIG. 3 (for convenience, some structures are not illustrated in FIG. 4, and FIG. 4 mainly shows the relative relationship between a patterned mask layer, a dummy gate, and sub dummy gates), FIG. 5 is a schematic drawing in a step subsequent to FIG. 3, FIG. 6 is a schematic drawing in a step subsequent to FIG. 5, and FIG. 7 is a schematic drawing in a step subsequent to FIG. 6. FIG. 8 is a flow chart of a manufacturing method of a high voltage semiconductor device according to an embodiment of the present invention. In some embodiments, FIG. 1 may be regarded as a schematic drawing in a step subsequent to FIG. 7, but not limited thereto. As shown in FIG. 1 and FIG. 2, the manufacturing method of the high voltage semiconductor device 101 in this embodiment may include the following steps. The first drift region 12A is formed in the semiconductor substrate 10, the gate structure 60G is formed on the semiconductor substrate 10, and the sub gate structure 60A is formed on the first drift region 12A. The sub gate structure 60A is separated from the gate structure 60G. The spacer structure SP1 is located on a sidewall of the gate structure 60G, the spacer structure SP2 is located on a sidewall of the sub gate structure 60A, and the first insulation structure BS1 is located on the first drift region 12A. At least a part of the first insulation structure BS1 is located between the spacer structure SP1 and the spacer structure SP2. A portion of the first drift region 12A (such as the first portion P1) is located between the spacer structure SP1 and the spacer structure SP2, and the first insulation structure BS1 is directly connected with the first portion P1 of the first drift region 12A.

Specifically, the manufacturing method in this embodiment may include but is not limited to the following steps. As shown in FIG. 3, FIG. 4, and FIG. 8, the first drift region 12A and the second drift region 12B are formed in the semiconductor substrate 10. Subsequently, the step S1 may be carried out for forming a dummy gate 24G, a sub dummy gate 24A, and a sub dummy gate 24B on the semiconductor substrate 10. The dummy gate 24G, the sub dummy gate 24A, and the sub dummy gate 24B may be elongated in the second direction D2, respectively. The sub dummy gate 24A and the sub dummy gate 24B may be located at two opposite sides of the dummy gate 24G in the first direction D1, respectively. The dummy gate 24G, the sub dummy gate 24A, and the sub dummy gate 24B are separated from one another. In some embodiments, an oxide layer 22 may be formed on the semiconductor substrate 10 before the step of forming the dummy gate 24G, the sub dummy gate 24A, and the sub dummy gate 24B. The dummy gate 24G, the sub dummy gate 24A, and the sub dummy gate 24B may be formed on the oxide layer 22.

Subsequently, as shown in FIG. 3, FIG. 5, and FIG. 8, the step S2 may be carried out for performing a patterning process 91 to the oxide layer 22. A part of the oxide layer 22 may be patterned to be the gate oxide layer 22G, the gate oxide layer 22A, the gate oxide layer 22B, the first insulation structure BS1, and the second insulation structure BS2. At least a portion of the gate oxide layer 22G may be sandwiched between the dummy gate 24G and the first drift region 12A in the third direction D3, at least a portion of the gate oxide layer 22A may be sandwiched between the sub dummy gate 24A and the first drift region 12A in the third direction D3, and at least a portion of the gate oxide layer 22B may be sandwiched between the sub dummy gate 24B and the second drift region 12B in the third direction D3.

In some embodiments, as shown in FIGS. 3-5, a first patterned mask layer 42 may be formed covering the dummy gate 24G, the sub dummy gate 24A, the sub dummy gate 24B, the oxide layer 22 located between the dummy gate 24G and the sub dummy gate 24A, and the oxide layer 22 located between the dummy gate 24G and the sub dummy gate 24B before the patterning process 91. The patterning process 91 may include an etching process using the first patterned mask layer 42 as a mask for removing a part of the oxide layer 22 so as to form the gate oxide layer 22G, the gate oxide layer 22A, the gate oxide layer 22B, the first insulation structure BS1, and the second insulation structure BS2 described above. In some embodiments, a mask layer 32 may be formed conformally on the oxide layer 22, the dummy gate 24G, the sub dummy gate 24A, and the sub dummy gate 24B before the step of forming the first patterned mask layer 42. The first patterned mask layer 42 may be formed on the mask layer 32, and a material composition of the mask layer 32 may be different from that of the first patterned mask layer 42. For example, the first patterned mask layer 42 may include a patterned photoresist layer, and the mask layer 32 may include silicon nitride or other suitable mask materials, but not limited thereto.

As shown in FIG. 3 and FIG. 5, the mask layer 32 and the oxide layer 22 without being covered by the first patterned mask layer 42 may be at least partially removed by the patterning process 91. At least a portion of the oxide layer 22 located between the dummy gate 24G and the sub dummy gate 24A may become the first insulation structure BS1 after the patterning process 91, and at least a portion of the oxide layer 22 located between the dummy gate 24G and the sub dummy gate 24B may become the second insulation structure BS2 after the patterning process 91. Therefore, the gate oxide layer 22A, the first insulation structure BS1, the gate oxide layer 22G, the second insulation structure BS2, and the gate oxide layer 22B may be connected with one another and have the same material composition.

As shown in FIG. 3, FIG. 5, FIG. 6, and FIG. 8, the first patterned mask layer 42 and the mask layer 32 may be removed after the patterning process 91, and the step S3 may be carried out for forming the spacer structure SP1, the spacer structure SP2, and the spacer structure SP3. The spacer structure SP1 may be formed on a sidewall of the dummy gate 24G, the spacer structure SP2 may be formed on a sidewall of the sub dummy gate 24A, and the spacer structure SP3 may be formed on a sidewall of the sub dummy gate 24B. In some embodiments, a portion of the gate oxide layer 22G may be sandwiched between the spacer structure SP1 and the first drift region 12A in the third direction D3, another portion of the gate oxide layer 22G may be sandwiched between the spacer structure SP1 and the second drift region 12B in the third direction D3, a portion of the gate oxide layer 22A may be sandwiched between the spacer structure SP2 and the first drift region 12A in the third direction D3, and a portion of the gate oxide layer 22B may be sandwiched between the spacer structure SP3 and the second drift region 12B in the third direction D3. In addition, the first insulation structure BS1 may be sandwiched between the gate oxide layer 22G and the gate oxide layer 22A in the first direction D1, and the first insulation structure BS1 may be directly connected with the gate oxide layer 22G and the gate oxide layer 22A. the second insulation structure BS2 may be sandwiched between the gate oxide layer 22G and the gate oxide layer 22B in the first direction D1, and the second insulation structure BS2 may be directly connected with the gate oxide layer 22G and the gate oxide layer 22B.

Additionally, after the patterning process 91, the source/drain doped region 52A may be formed in the first drift region 12A, and the source/drain doped region 52B may be formed in the second drift region 12B. In some embodiments, the spacer structure SP1, the spacer structure SP2, and the spacer structure SP3 may respectively include multiple layers of spacers, and the source/drain doped region 52A and the source/drain doped region 52B may be formed by a doping process using some of the spacers described above as a mask, but not limited thereto. Therefore, the sub gate structure 24A may be located between the dummy gate 24G and the source/drain doped region 52A in the first direction D1, and the sub gate structure 24B may be located between the dummy gate 24G and the source/drain doped region 52B in the first direction D1.

Subsequently, as shown in FIG. 7 and FIG. 8, the step S4 may be carried out for performing a silicide formation process 92, so as to form the silicide layer 54A in the source/drain doped region 52A and/or on the source/drain doped region 52A and form the silicide layer 54B in the source/drain doped region 52B and/or on the source/drain doped region 52B. In some embodiments, the silicide formation process 92 may include a self-aligned silicide formation process, a metal layer (not illustrated) covering the surfaces of the source/drain doped region 52A and the source/drain doped region 52B may be applied, and a thermal treatment may be performed for reacting the metal layer with the source/drain doped region 52A and the source/drain doped region 52B, so as to form the silicide layer 54A and the silicide layer 54B respectively. The metal layer may be removed after the silicide layer 54A and the silicide layer 54B are formed.

It is worth noting that, during the silicide formation process 92, the first drift region 12A located between the dummy gate 24G and the sub dummy gate 24A may be completely covered by the first insulation structure BS1, the gate oxide layer 22A, and the gate oxide layer 22G for avoiding forming an electrically conductive silicide layer on the first drift region 12A located between the spacer structure SP1 and the spacer structure SP2 and/or on the first drift region 12A located between the dummy gate 24G and the sub dummy gate 24A. During the silicide formation process 92, the second drift region 12B located between the dummy gate 24G and the sub dummy gate 24B may be completely covered by the second insulation structure BS2, the gate oxide layer 22B, and the gate oxide layer 22G for avoiding forming an electrically conductive silicide layer on the second drift region 12B located between the spacer structure SP1 and the spacer structure SP3 and/or on the second drift region 12B located between the dummy gate 24G and the sub dummy gate 24B.

Additionally, in some embodiments, the dummy gate 24G, the sub dummy gate 24A, and the sub dummy gate 24B may respectively include a dummy gate material (not illustrated) and a cap layer (not illustrated) covering the dummy gate material. The dummy gate material may include polysilicon or other suitable materials, and the cap layer may include oxide, nitride, or other suitable materials, but not limited thereto. During the silicide formation process 92, the cap layer may cover the dummy gate material for avoiding forming silicide layers on the dummy gate 24G, the sub dummy gate 24A, and the sub dummy gate 24B, but not limited thereto.

As shown in FIG. 7, FIG. 8, and FIG. 1, after the step of forming the silicide layer 54A and the silicide layer 54B, the insulation layer 56 may be formed, and the step S5 may be carried out for performing a replacement gate process, so as to replace the dummy gate 24G with the gate structure 60G, replace the sub dummy gate 24A with the sub gate structure 60A, and replace the sub dummy gate 24B with the sub gate structure 60B. Therefore, the sub gate structure 60A may be formed on the first drift region 12A, the sub gate structure 60B may be formed on the second drift region 12B, and the spacer structure SP1, the spacer structure SP2, and the spacer structure SP3 may be located on the sidewall of the gate structure 60G, the sidewall of the sub gate structure 60A, and the sidewall of the sub gate structure 60B, respectively. After the step of forming the gate structure 60G, the sub gate structure 60A, and the sub gate structure 60B, the dielectric layer 62 and the contact structures may be formed. It is worth noting that the method of forming the gate structure 60G, the sub gate structure 60A, and the sub gate structure 60B in the present invention is not limited to the steps described in FIGS. 3-8, and other suitable approaches may also be used to form the gate structure 60G, the sub gate structure 60A, and the sub gate structure 60B according to other design considerations. In addition, the first insulation structure BS1 and the second insulation structure BS2 in this embodiment may be formed by performing the patterning process to the oxide layer (such as the patterning process 91 shown in FIG. 3), and the purpose of process simplification and/or process integration may be achieved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
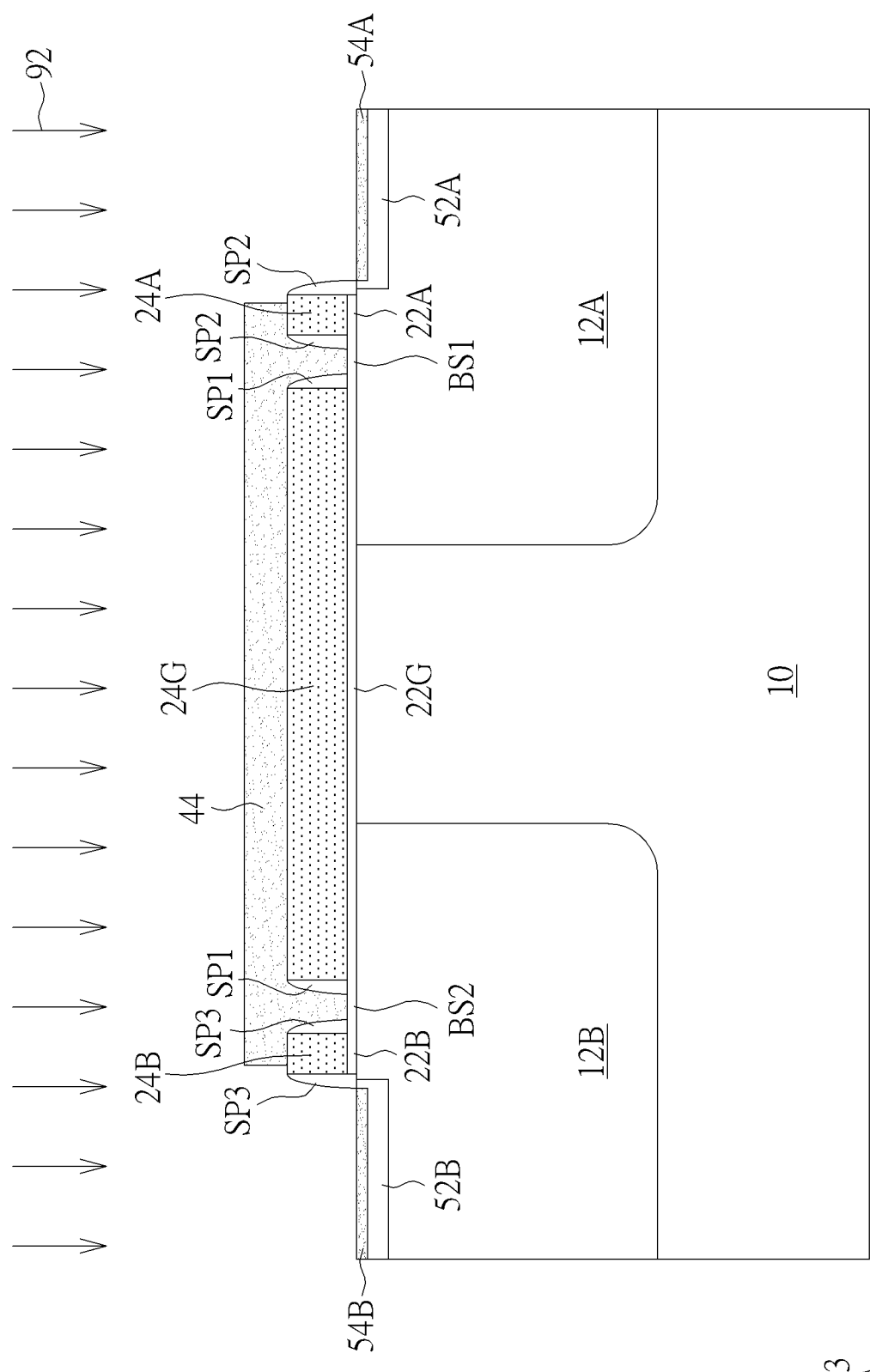
FIG. 9 is a schematic drawing illustrating a manufacturing method of a high voltage semiconductor device according to another embodiment of the present invention.
Figure 10:
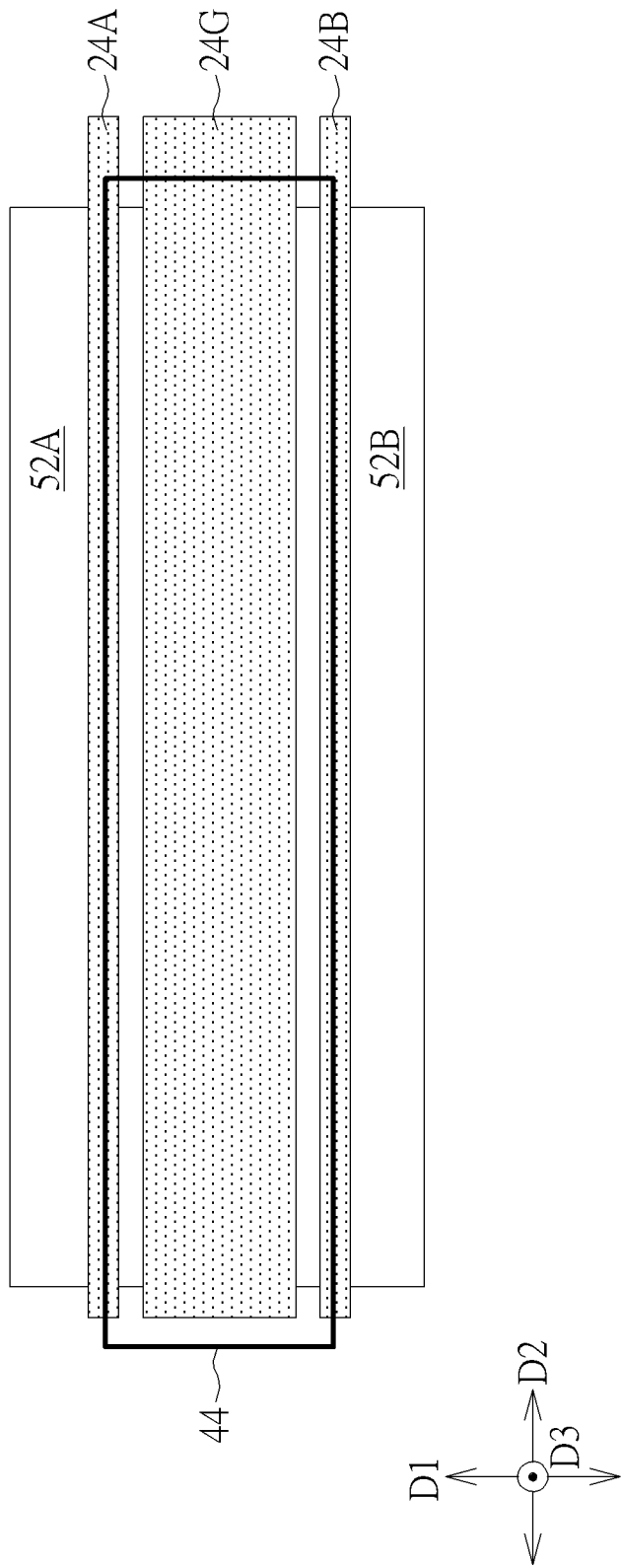
FIG. 10 is a top view schematic drawing corresponding to FIG. 9.

Please refer to FIG. 6, FIG. 9, and FIG. 10. FIG. 9 is a schematic drawing illustrating a manufacturing method of a high voltage semiconductor device according to another embodiment of the present invention, and FIG. 10 is a top view schematic drawing corresponding to FIG. 9 (for convenience, some structures are not illustrated in FIG. 10, and FIG. 10 mainly shows the relative relationship between a patterned mask layer, a dummy gate, and sub dummy gates). In some embodiments, FIG. 9 may be regarded as a schematic drawing in a step subsequent to FIG. 6, but not limited thereto. As shown in FIG. 6, FIG. 9, and FIG. 10, in some embodiments, a second patterned mask layer 44 may be formed on the semiconductor substrate 10 before the silicide formation process 92. The second patterned mask layer 44 may cover the dummy gate 24G, the sub dummy gate 24A, the sub dummy gate 24B, the spacer structure SP1, the spacer structure SP2, and the first insulation structure BS1 located between the dummy gate 24G and the sub dummy gate 24A, and the spacer structure SP1, the spacer structure SP3, and the second insulation structure BS2 located between the dummy gate 24G and the sub dummy gate 24B.

During the silicide formation process 92, the first drift region 12A located between the spacer structure SP1 and the spacer structure SP2 and the second drift region 12B located between the spacer structure SP1 and the spacer structure SP3 may be completely covered by the second patterned mask layer 44, the first insulation structure BS1, and the second insulation structure BS2 for avoiding forming an electrically conductive silicide layer on the first drift region 12A located between the spacer structure SP1 and the spacer structure SP2 and the second drift region 12B located between the spacer structure SP1 and the spacer structure SP3. The second patterned mask layer 44 may be regarded as a structure for blocking the formation of the silicide, but not limited thereto. In some embodiments, the effect of preventing the formation of silicide may be further enhanced by the second patterned mask layer 44 covering the first insulation structure BS1 and the second insulation structure BS2 during the silicide formation process 92. Additionally, in some embodiments, the second patterned mask layer 44 may be completely removed after the silicide formation process 92 or at least some of the second patterned mask layer 44 may remain between the spacer structure SP1 and the spacer structure SP2 and remain between the spacer structure SP1 and the spacer structure SP3 after the silicide formation process 92. The second patterned mask layer 44 may include nitride (such as silicon nitride) or other suitable mask materials.

Figure 11:
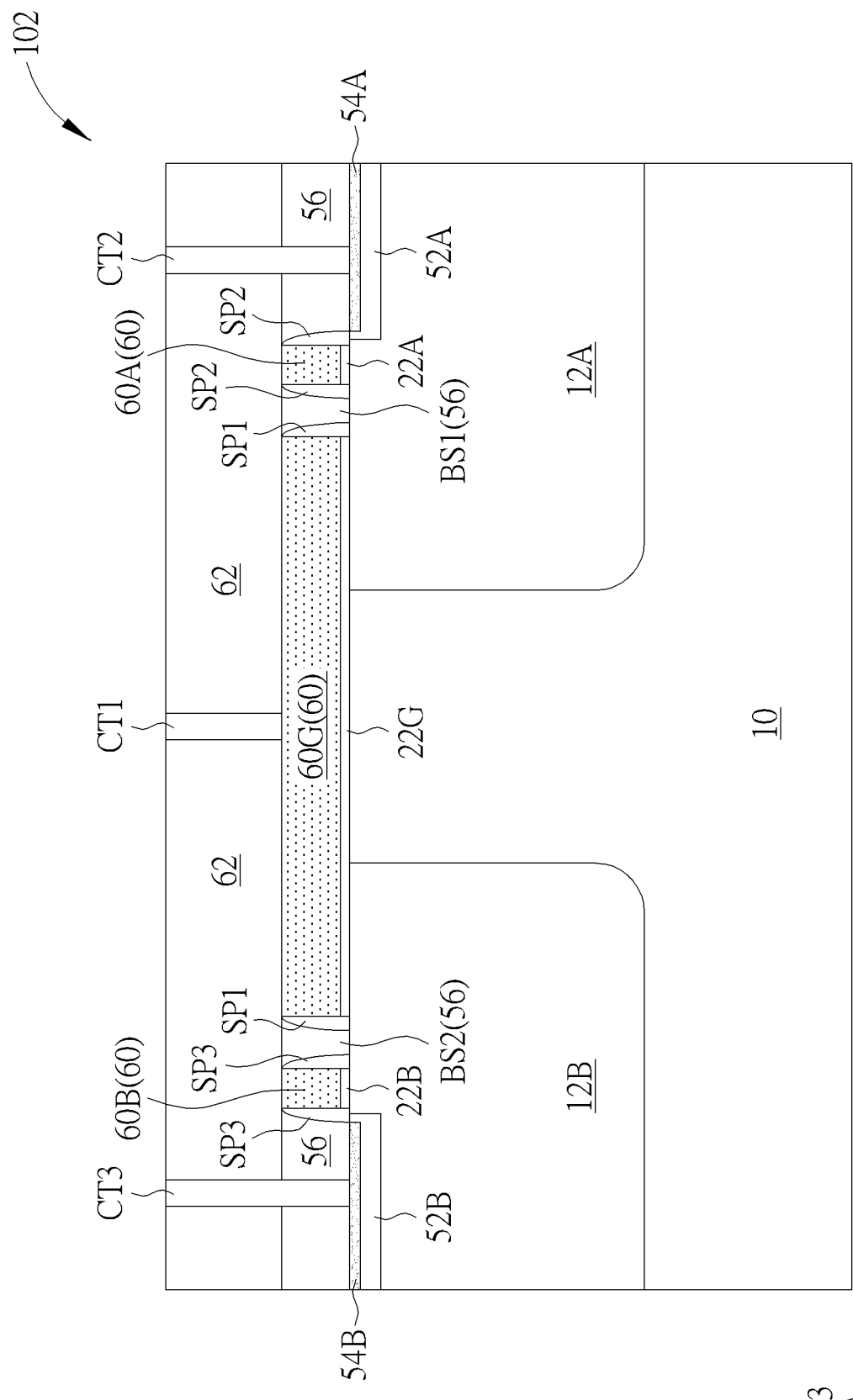
FIG. 11 is a schematic drawing illustrating a high voltage semiconductor device according to a second embodiment of the present invention.
Figure 12:
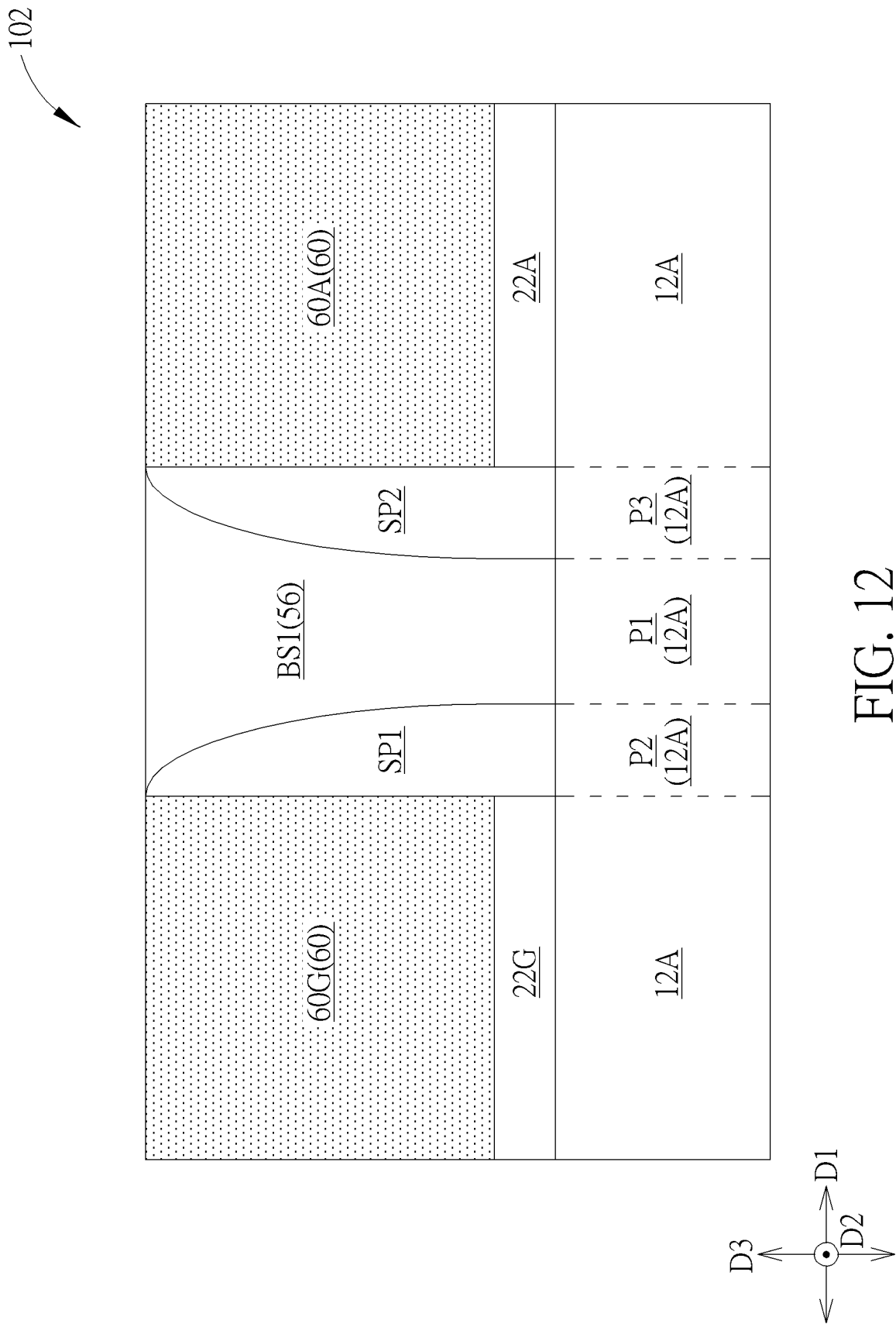
FIG. 12 is a schematic drawing illustrating an enlarged portion of the high voltage semiconductor device according to the second embodiment of the present invention.

Please refer to FIG. 11 and FIG. 12. FIG. 11 is a schematic drawing illustrating a high voltage semiconductor device 102 according to a second embodiment of the present invention, and FIG. 12 is a schematic drawing illustrating an enlarged portion of the high voltage semiconductor device 102 in this embodiment. As shown in FIG. 11 and FIG. 12, in the high voltage semiconductor device 102, the first insulation structure BS1 and the second insulation structure BS2 may be formed with some of the insulation layer 56.

Therefore, the first insulation structure BS1 may be sandwiched between the spacer structure SP1 and the spacer structure SP2 in the first direction D1, and the second insulation structure BS2 may be sandwiched between the spacer structure SP1 and the spacer structure SP3 in the first direction D1. In some embodiments, by the influence of the replacement gate process described above, the spacer structure SP1, the spacer structure SP2, the spacer structure SP3, the first insulation structure BS1, and the second insulation structure BS2 may be treated by a planarization process and have top surfaces (such as the topmost surfaces) substantially coplanar with one another, but not limited thereto.

Figure 13:
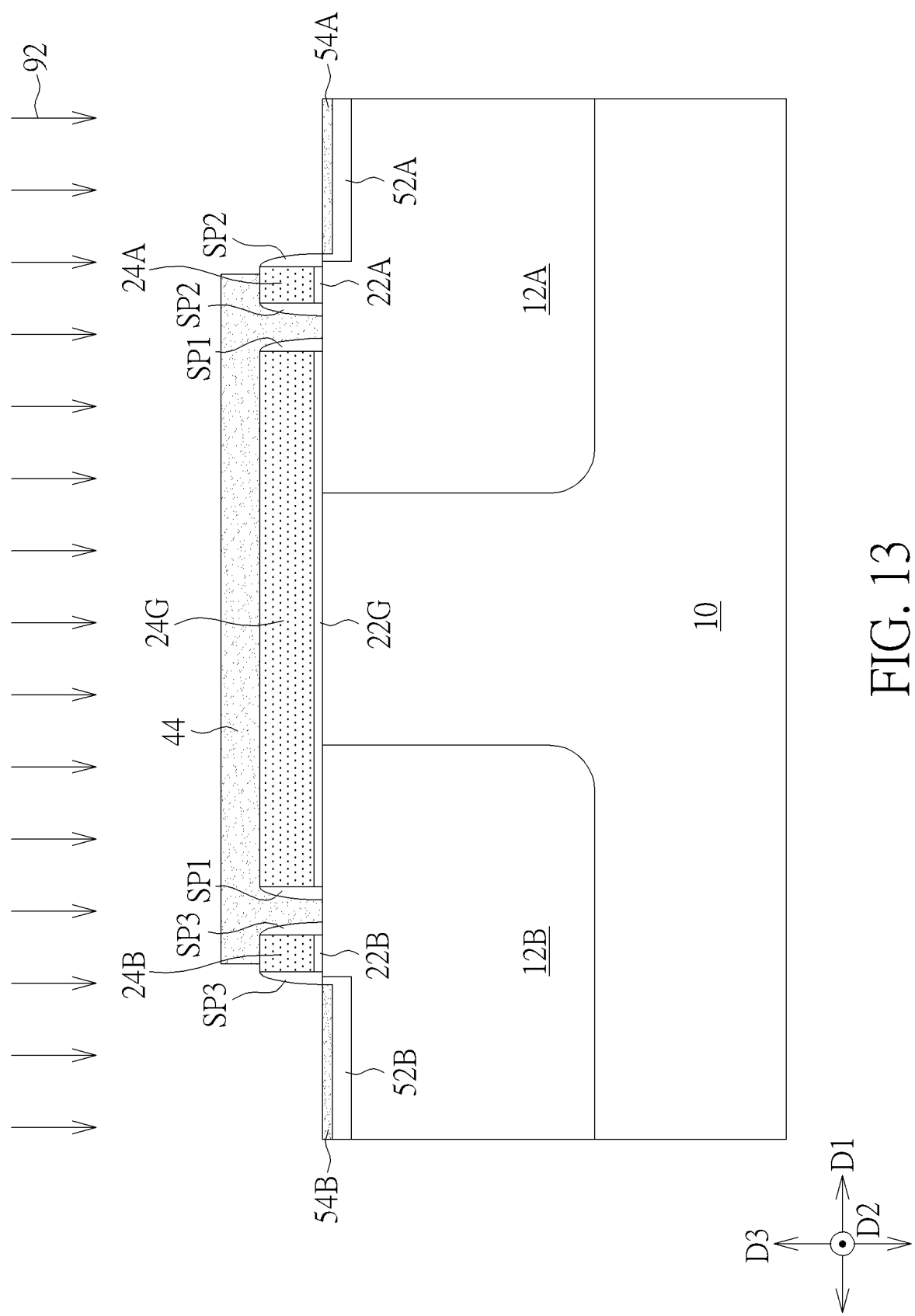
FIG. 13 is a schematic drawing illustrating a manufacturing method of the high voltage semiconductor device according to the second embodiment of the present invention.

Please refer to FIGS. 11-13. FIG. 13 is a schematic drawing illustrating a manufacturing method of the high voltage semiconductor device according to the second embodiment of the present invention, and FIG. 11 may be regarded as a schematic drawing in a step subsequent to FIG. 13, but not limited thereto. As shown in FIGS. 11-13, in some embodiments, the gate oxide layer 22G, the gate oxide layer 22A, and the gate oxide layer 22B may be separated from one another. The spacer structure SP1 may be disposed on sidewalls of the dummy gate 24G and the gate oxide layer 22G, the spacer structure SP2 may be disposed on sidewalls of the sub dummy gate 24A and the gate oxide layer 22A, and the spacer structure SP3 may be disposed on sidewalls of the sub dummy gate 24B and the gate oxide layer 22B. Additionally, during the silicide formation process 92, the second patterned mask layer 44 may cover the dummy gate 24G, the sub dummy gate 24A, the sub dummy gate 24B, the spacer structure SP1, the spacer structure SP2, and the first drift region 12A located between the dummy gate 24G and the sub dummy gate 24A, and the spacer structure SP1, the spacer structure SP3, and the second drift region 12B located between the dummy gate 24G and the sub dummy gate 24B. In some embodiments, the second patterned mask layer 44 may directly contact the first drift region 12A located between the spacer structure SP1 and the spacer structure SP2 and the second drift region 12B located between the spacer structure SP1 and the spacer structure SP3.

In some embodiments, after the silicide formation process 92, the insulation layer 56 may be formed for forming the first insulation structure BS1 between the spacer structure SP1 and the spacer structure SP2 and the second insulation structure BS2 between the spacer structure SP1 and the spacer structure SP3. Subsequently, the replacement gate process described above may be performed for forming the gate structure 60G, the sub gate structure 60A, and the sub gate structure 60B. In other words, the first insulation structure BS1 and the second insulation structure BS2 may be formed after the silicide formation process 92 and before the replacement gate process. Additionally, in some embodiments, the second patterned mask layer 44 may be completely removed after the silicide formation process 92 or at least some of the second patterned mask layer 44 may remain between the spacer structure SP1 and the spacer structure SP2 and remain between the spacer structure SP1 and the spacer structure SP3 after the silicide formation process 92 for becoming the first insulation structure BS1 and the second insulation structure BS2.

Figure 14:
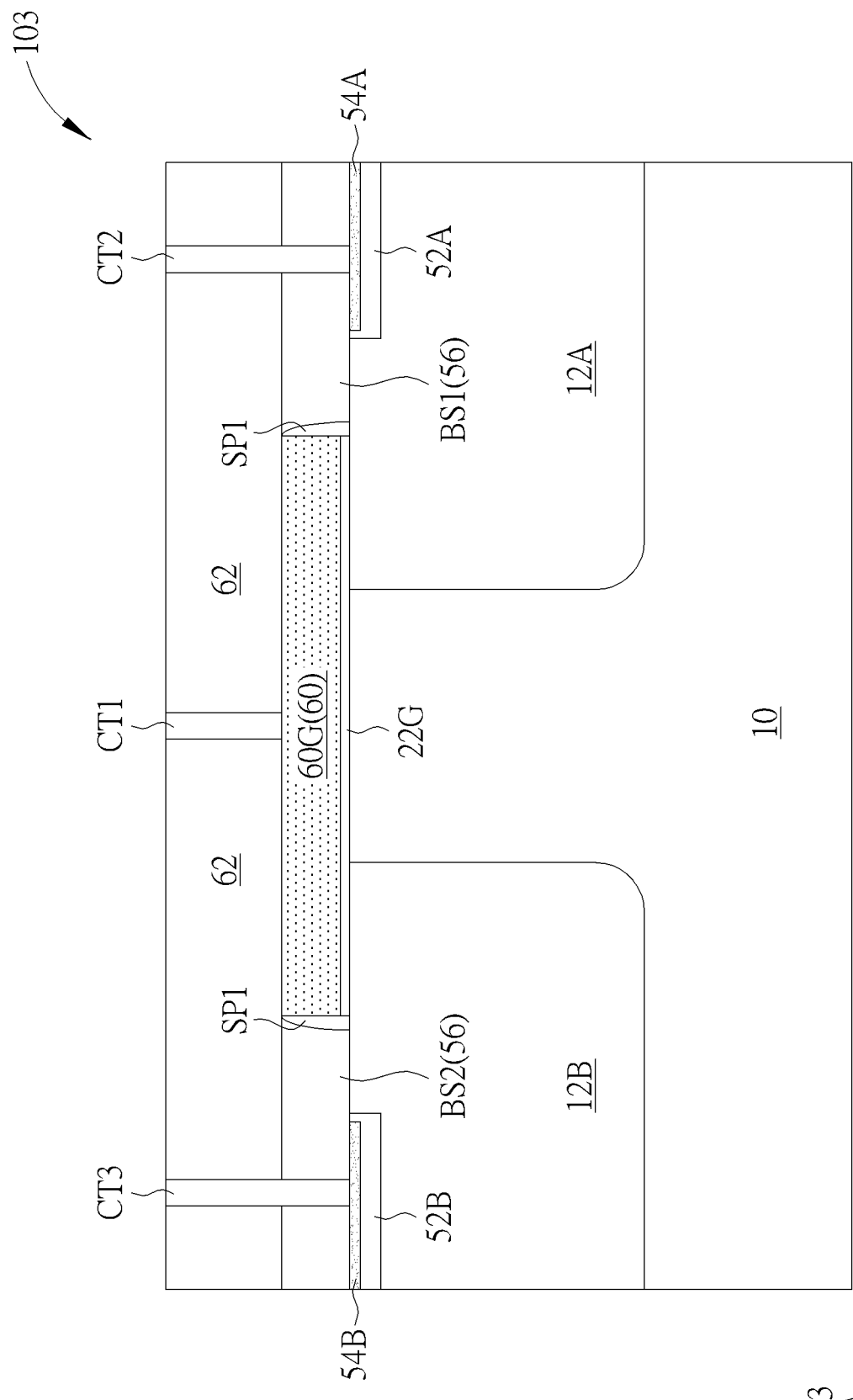
FIG. 14 is a schematic drawing illustrating a high voltage semiconductor device according to a third embodiment of the present invention.

Please refer to FIG. 14. FIG. 14 is a schematic drawing illustrating a high voltage semiconductor device 103 according to a third embodiment of the present invention. As shown in FIG. 14, the high voltage semiconductor device 103 includes the semiconductor substrate 10, the first drift region 12A, the gate structure 60G, the spacer structure SP1, the source/drain doped region 52A, the silicide layer 54A, and the first insulation structure BS1. The first drift region 12A is disposed in the semiconductor substrate 10, the gate structure 60G is disposed on the semiconductor substrate 10, and the spacer structure SP1 is disposed on a sidewall of the gate structure 60G. The source/drain doped region 52A is disposed in the first drift region 12A, and the source/drain doped region 52A is separated from the spacer structure SP1. The silicide layer 54A is disposed on the source/drain doped region 52A, the silicide layer 54A is separated from the spacer structure SP1, and a portion of the first drift region 12A is located between the spacer structure SP1 and the source/drain doped region 52A. The first insulation structure BS1 is disposed on the first drift region 12A, and the first insulation structure BS1 is directly connected with the portion of the first drift region 12A located between the spacer structure SP1 and the source/drain doped region 52A.

In some embodiments, the high voltage semiconductor device 103 may further include the second drift region 12B, the source/drain doped region 52B, the silicide layer 54B, and the second insulation structure BS2. The second drift region 12B is disposed in the semiconductor substrate 10, and a part of the first drift region 12A and a part of the second drift region 12B may be located at two opposite sides of the gate structure 60G in the first direction D1, respectively. The source/drain doped region 52B may be disposed in the second drift region 12B, and the source/drain doped region 52B is separated from the spacer structure SP1. The silicide layer 54B may be disposed on the source/drain doped region 52B. The silicide layer 54B is separated from the spacer structure SP1, and a portion of the second drift region 12B is located between the spacer structure SP1 and the source/drain doped region 52B. The second insulation structure BS2 may be disposed on the second drift region 12B, and the second insulation structure BS2 is directly connected with the portion of the second drift region 12B located between the spacer structure SP1 and the source/drain doped region 52B.

In some embodiments, the sub gate structures in the embodiments described above are not disposed in the high voltage semiconductor device 103. The first drift region 12A located between the spacer structure SP1 and the source/drain doped region 52A may directly contact and be completely covered by the first insulation structure BS1, and the second drift region 12B located between the spacer structure SP1 and the source/drain doped region 52B may directly contact and be completely covered by the second insulation structure BS2. In some embodiments, the first insulation structure BS1 and the second insulation structure BS2 may be formed with the insulation layer 56 described above. Therefore, the first insulation structure BS1 may further cover the source/drain doped region 52A and the silicide layer 54A in the third direction D3, the second insulation structure BS2 may further cover the source/drain doped region 52B and the silicide layer 54B in the third direction D3, and the top surfaces (such as the topmost surfaces) of the first insulation structure BS1, the second insulation structure BS2, the spacer structure SP1, and the gate structure 60G may be substantially coplanar with one another, but not limited thereto.

Figure 15:
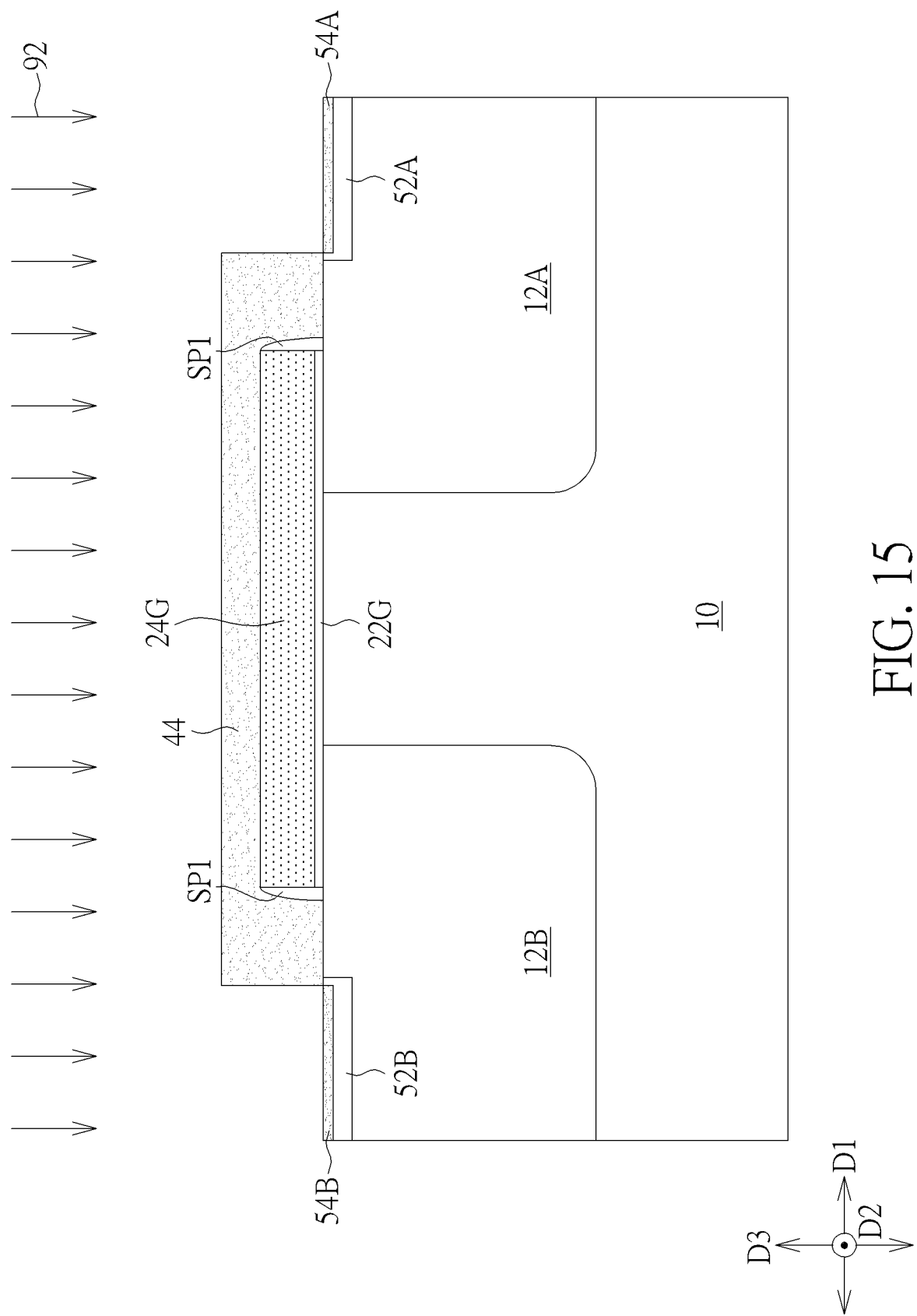
FIG. 15 is a schematic drawing illustrating a manufacturing method of the high voltage semiconductor device according to the third embodiment of the present invention.

Please refer to FIG. 14 and FIG. 15. FIG. 15 is a schematic drawing illustrating a manufacturing method of the high voltage semiconductor device according to the third embodiment of the present invention, and FIG. 14 may be regarded as a schematic drawing in a step subsequent to FIG. 15. As shown in FIG. 14 and FIG. 15, during the silicide formation process 92, the second patterned mask layer 44 may cover the dummy gate 24G, the spacer structure SP1, the first drift region 12A located between the spacer structure SP1 and the source/drain doped region 52A, and the second drift region 12B located between the spacer structure SP1 and the source/drain doped region 52B. In some embodiments, the second patterned mask layer 44 may directly contact the first drift region 12A and the second drift region 12B, but not limited thereto. In some embodiments, the second patterned mask layer 44 may be completely removed after the silicide formation process 92 or at least some of the second patterned mask layer 44 may remain on the first drift region 12A and the second drift region 12B after the silicide formation process 92 for becoming the first insulation structure BS1 and the second insulation structure BS2. Additionally, in the process of forming the source/drain doped region 52A and the source/drain doped region 52B, another patterned mask layer (not illustrated) may be used to cover the dummy gate 24G, the spacer structure SP1, a part of the first drift region 12A, and a part of the second drift region 12B, and the distance between the source/drain doped region and the spacer structure SP1 may be controlled by adjusting the condition of the patterned mask layer covering the first drift region 12A and the second drift region 12B. In other words, the electrical performance of the high voltage semiconductor device 103 may be improved (for example, the off current may be reduced, but not limited thereto) by increasing the distance between the source/drain doped region and the spacer structure SP1 and avoiding forming the electrically conductive silicide layer on the first drift region 12A located between the source/drain doped region 52A and the spacer structure SP1 and on the second drift region 12B located between the source/drain doped region 52B and the spacer structure SP1.

To summarize the above descriptions, according to the high voltage semiconductor device and the manufacturing method thereof in the present invention, the insulation structure connected with the drift region may be used for avoiding forming silicide on the specific portion of the drift region, and the electrical performance of the high voltage semiconductor device may be improved accordingly. Additionally, in some embodiments, the structure for blocking the formation of silicide may be formed by the related process of the gate oxide layer, and the purpose of process simplification and/or process integration may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high voltage semiconductor device, comprising:
a semiconductor substrate;
a first drift region disposed in the semiconductor substrate;
a gate structure disposed on the semiconductor substrate;
a first sub gate structure disposed on the first drift region and separated from the gate structure;
a first spacer structure disposed on a sidewall of the gate structure;
a second spacer structure disposed on a sidewall of the first sub gate structure;
a first insulation structure disposed on the first drift region, wherein at least a part of the first insulation structure is located between the first spacer structure and the second spacer structure, a first portion of the first drift region is located between the first spacer structure and the second spacer structure, and the first insulation structure is directly connected with the first portion of the first drift region;
a first gate oxide layer, wherein a part of the first gate oxide layer is sandwiched between the first spacer structure and the first drift region; and
a second gate oxide layer, wherein a part of the second gate oxide layer is sandwiched between the second spacer structure and the first drift region, and the first insulation structure is sandwiched between the first gate oxide layer and the second gate oxide layer.

2. The high voltage semiconductor device according to claim 1, wherein the first insulation structure is directly connected with the first gate oxide layer and the second gate oxide layer.

3. The high voltage semiconductor device according to claim 1, wherein a material composition of the first insulation structure, a material composition of the first gate oxide layer, and a material composition of the second gate oxide layer are identical to one another.

4. The high voltage semiconductor device according to claim 1, wherein the first insulation structure is sandwiched between the first spacer structure and the second spacer structure.

5. The high voltage semiconductor device according to claim 1, wherein a second portion of the first drift region is located under the first spacer structure in a vertical direction, a third portion of the first drift region is located under the second spacer structure in the vertical direction, and the first portion of the first drift region is sandwiched between the second portion of the first drift region and the third portion of the first drift region in a horizontal direction.

6. The high voltage semiconductor device according to claim 1, further comprising:
a first source/drain doped region disposed in the first drift region, wherein the first sub gate structure is located between the gate structure and the first source/drain doped region, and the first sub gate structure is electrically separated from the gate structure and the first source/drain doped region.

7. The high voltage semiconductor device according to claim 1, further comprising:
a second drift region disposed in the semiconductor substrate, wherein a part of the first drift region and a part of the second drift region are located at two opposite sides of the gate structure in a horizontal direction, respectively;
a second sub gate structure disposed on the second drift region and separated from the gate structure;
a third spacer structure disposed on a sidewall of the second sub gate structure; and
a second insulation structure disposed on the second drift region, wherein at least a part of the second insulation structure is located between the first spacer structure and the third spacer structure, a portion of the second drift region is located between the first spacer structure and the third spacer structure, and the second insulation structure is directly connected with the portion of the second drift region.

8. The high voltage semiconductor device according to claim 7, further comprising:
a second source/drain doped region disposed in the second drift region, wherein the second sub gate structure is located between the gate structure and the second source/drain doped region, and the second sub gate structure is electrically separated from the gate structure and the second source/drain doped region.

9. A high voltage semiconductor device, comprising:
a semiconductor substrate;
a first drift region disposed in the semiconductor substrate;
a gate structure disposed on the semiconductor substrate;
a spacer structure disposed on a sidewall of the gate structure;
a first source/drain doped region disposed in the first drift region, wherein the first source/drain doped region is separated from the spacer structure;
a first silicide layer disposed on the first source/drain doped region, wherein the first silicide layer is separated from the spacer structure, and a portion of the first drift region is located between the spacer structure and the first source/drain doped region;
a first insulation structure disposed on the first drift region, wherein the first insulation structure is directly connected with the portion of the first drift region located between the spacer structure and the first source/drain doped region;
a second drift region disposed in the semiconductor substrate, wherein a part of the first drift region and a part of the second drift region are located at two opposite sides of the gate structure in a horizontal direction, respectively;
a second source/drain doped region disposed in the second drift region, wherein the second source/drain doped region is separated from the spacer structure;
a second silicide layer disposed on the second source/drain doped region, wherein the second silicide layer is separated from the spacer structure, and a portion of the second drift region is located between the spacer structure and the second source/drain doped region; and
a second insulation structure disposed on the second drift region, wherein the second insulation structure is directly connected with the portion of the second drift region located between the spacer structure and the second source/drain doped region.

10. The high voltage semiconductor device according to claim 9, wherein the first drift region located between the spacer structure and the first source/drain doped region is completely covered by the first insulation structure.

11. The high voltage semiconductor device according to claim 9, wherein the first insulation structure further covers the first source/drain doped region and the first silicide layer.

12. The high voltage semiconductor device according to claim 9, wherein the second drift region located between the spacer structure and the second source/drain doped region is completely covered by the second insulation structure.

13. The high voltage semiconductor device according to claim 9, wherein the second insulation structure further covers the second source/drain doped region and the second silicide layer.

* * * * *